(12) United States Patent
Miyata et al.

(10) Patent No.: US 11,829,676 B2
(45) Date of Patent: Nov. 28, 2023

(54) INFORMATION PROCESSING APPARATUS AND INFORMATION PROCESSING METHOD

(71) Applicant: CANON KABUSHIKI KAISHA, Tokyo (JP)

(72) Inventors: Naoki Miyata, Tochigi (JP); Kenta Kita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 17/239,332

(22) Filed: Apr. 23, 2021

(65) Prior Publication Data
US 2021/0333721 A1  Oct. 28, 2021

(30) Foreign Application Priority Data

Apr. 28, 2020 (JP) .................................. 2020-079055

(51) Int. Cl.
| | | |
|---|---|---|
| *G06F 3/14* | (2006.01) | |
| *G06F 16/9038* | (2019.01) | |
| *G06F 16/901* | (2019.01) | |
| *G03F 7/00* | (2006.01) | |
| *G03F 9/00* | (2006.01) | |
| *G06F 3/147* | (2006.01) | |

(52) U.S. Cl.
CPC ............ *G06F 3/14* (2013.01); *G03F 7/70491* (2013.01); *G03F 7/70633* (2013.01); *G03F 9/7046* (2013.01); *G06F 3/147* (2013.01); *G06F 16/9024* (2019.01); *G06F 16/9038* (2019.01)

(58) Field of Classification Search
None
See application file for complete search history.

(56) References Cited

U.S. PATENT DOCUMENTS

2006/0090141 A1* 4/2006 Loui ..................... G06F 16/447
715/764
2010/0229902 A1* 9/2010 Kanzaki ................. H01L 22/12
134/56 R (Continued)

FOREIGN PATENT DOCUMENTS

JP   2006-237052 A   9/2006
JP   2009170612 A    7/2009

(Continued)

*Primary Examiner* — Toan H Vu
(74) *Attorney, Agent, or Firm* — Canon U.S.A., Inc. IP Division

(57) ABSTRACT

An information processing apparatus includes an acquisition unit configured to acquire information containing first process data indicating a result of a substrate process in a first process condition and second process data indicating a result of a substrate process in a second process condition different from the first process condition, and a display control unit configured to control a display on a display apparatus based on the information acquired by the acquisition unit, wherein the display control unit is configured to display, on the display apparatus, a first screen displaying a first data group in which the first process data is arranged chronologically and a second data group in which the second process data is arranged chronologically, the first screen displaying the first data group in a region and the second data group in another region.

12 Claims, 10 Drawing Sheets

(56) References Cited

U.S. PATENT DOCUMENTS

| | | | |
|---|---|---|---|
| 2012/0010743 A1* | 1/2012 | Asai | H01L 21/67775 |
| | | | 707/E17.014 |
| 2013/0198652 A1* | 8/2013 | Dunn | G06Q 50/01 |
| | | | 715/751 |
| 2015/0039116 A1 | 2/2015 | Yamamoto | |
| 2016/0092043 A1* | 3/2016 | Missig | G06F 3/0482 |
| | | | 715/811 |
| 2016/0147766 A1* | 5/2016 | Davidoff | G06F 16/9535 |
| | | | 707/725 |
| 2017/0026552 A1* | 1/2017 | Tomono | H04N 1/628 |
| 2018/0267512 A1 | 9/2018 | Yamamoto | |
| 2019/0012847 A1 | 1/2019 | Fukuda | |
| 2020/0294296 A1* | 9/2020 | Yamagata | A61B 5/7425 |
| 2021/0035301 A1* | 2/2021 | Soares | G06F 3/04883 |

FOREIGN PATENT DOCUMENTS

| | | |
|---|---|---|
| TW | 200616013 A | 5/2006 |
| TW | 201330146 A | 7/2013 |

* cited by examiner

INFORMATION PROCESSING APPARATUS AND INFORMATION PROCESSING METHOD

BACKGROUND OF THE INVENTION

Field of the Invention

The present invention relates to an information processing apparatus and an information processing method.

Description of the Related Art

In semiconductor manufacturing factories, semiconductor manufacturing apparatuses such as substrate processing apparatuses that process substrates are generally installed, and the substrates are to be processed efficiently while an operation status of each apparatus is checked. Further, in a case where a failure occurs in the semiconductor manufacturing apparatuses, an operation is to be performed promptly to overcome the failure.

Japanese Patent Application Laid-Open Publication No. 2009-170612 discusses a technique for detecting a failure in a semiconductor manufacturing apparatus. Specifically, a process result of the semiconductor manufacturing apparatus is statistically processed in units of lots each including a plurality of substrates, and a result of the statistical process is displayed as a graph. This makes it easy for a user to instantly identify a lot in which a failure has occurred.

However, even when the graph is displayed by lots each including a plurality of substrates, it is difficult to instantly determine what kind of trend exists depending on the difference of each recipe, each recipe being a process condition of the semiconductor manufacturing apparatus. In a case where a failure occurs due to a recipe, to determine the cause of the failure, information about each recipe needs to be organized, and the trends of the recipes need to be compared. Unless the user collects the data and analyzes the data, the user cannot determine the trend of each recipe, and it takes a significant amount of time to overcome the failure.

SUMMARY OF THE INVENTION

According to an aspect of the present invention, an information processing apparatus includes an acquisition unit configured to acquire information containing first process data indicating a result of a substrate process in a first process condition and second process data indicating a result of a substrate process in a second process condition different from the first process condition, and a display control unit configured to control a display on a display apparatus based on the information acquired by the acquisition unit, wherein the display control unit is configured to display, on the display apparatus, a first screen displaying a first data group in which the first process data is arranged chronologically and a second data group in which the second process data is arranged chronologically, the first screen displaying the first data group in a region and the second data group in another region.

Further features of the present invention will become apparent from the following description of embodiments with reference to the attached drawings.

DESCRIPTION OF THE EMBODIMENTS

Various embodiments of the present invention will be described in detail below with reference to the attached drawings.

Figure 1:
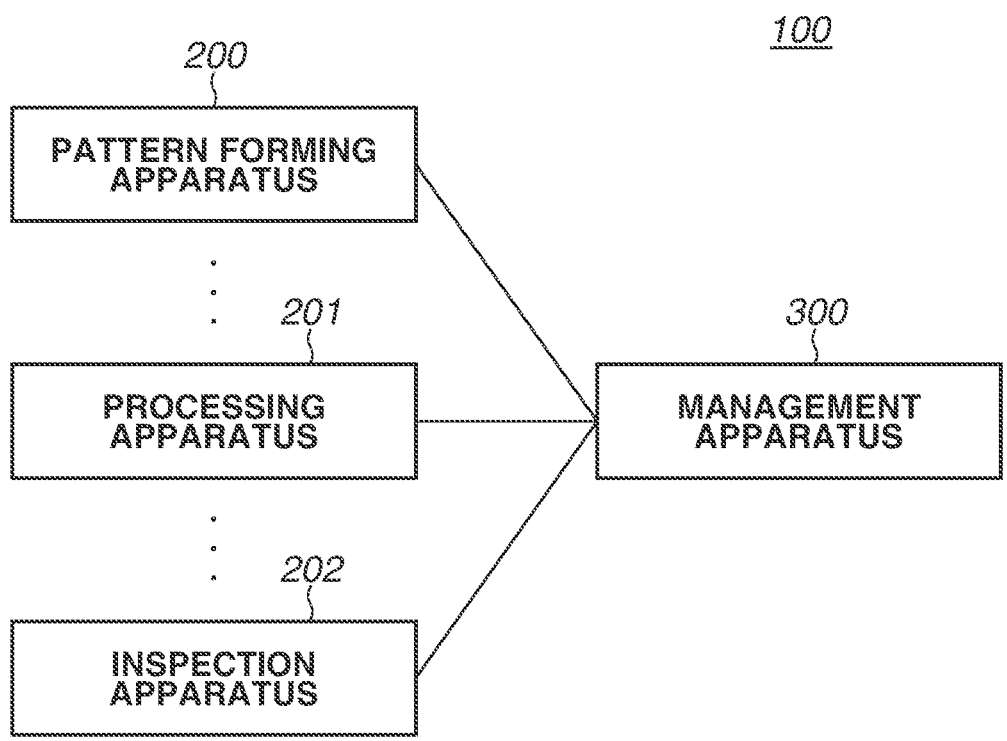
FIG. 1 is a diagram illustrating an article manufacturing system.

In a first embodiment, an article manufacturing system including a plurality of apparatuses and a management apparatus that manages the plurality of apparatuses will be described. FIG. 1 is a diagram illustrating the article manufacturing system. An article manufacturing system 100 according to the present embodiment includes a pattern forming apparatus 200, a processing apparatus 201, an inspection apparatus 202, and a management apparatus 300. The pattern forming apparatus 200 forms a pattern on a wafer (substrate). The management apparatus 300 manages the pattern forming apparatus 200, the processing apparatus 201, and the inspection apparatus 202. Further, the pattern forming apparatus 200, the processing apparatus 201, and the inspection apparatus 202 of the article manufacturing system 100 each include one or more apparatuses.

The pattern forming apparatus 200 includes an exposure apparatus that illuminates a reticle (mask, original plate) having a pattern formed thereon with light and projects the pattern onto a shot region on the wafer with the light from the reticle. Further, the pattern forming apparatus 200 includes an imprint apparatus that forms a composition having a cast shape transferred thereto by, for example, bringing an imprint material fed onto a wafer into contact with a cast (original plate, mold) and applying energy for curing to the imprint material. Further, the pattern forming apparatus 200 includes a drawing apparatus that performs drawing on a substrate with charged particle beams such as electron beams and ion beams via a charged particle optical system to form a pattern on the substrate. The pattern forming apparatus 200 performs a substrate process using the foregoing methods.

The processing apparatus 201 includes manufacturing apparatuses that perform processes other than those that are performed by apparatuses such as an exposure apparatus in manufacturing of articles such as devices. Examples of manufacturing apparatuses are an application apparatus that applies a photosensitive medium to a surface of a substrate and a development apparatus that develops the substrate having a pattern transferred thereto. The processing apparatus 201 further includes other apparatuses such as an etching apparatus and a film forming apparatus.

The inspection apparatus 202 includes, for example, an overlay inspection apparatus, a line width inspection apparatus, a pattern inspection apparatus, and an electrical characteristics inspection apparatus. The overlay inspection apparatus is an apparatus that inspects the accuracy of a displacement between patterns on upper and lower layers of a substrate including a plurality of layers each having a pattern formed thereon. Further, the line width inspection apparatus is an apparatus that inspects the accuracy of size such as a line width of a pattern formed on a substrate. Further, the pattern inspection apparatus is an apparatus that inspects the presence or absence of a pattern that does not satisfy an accuracy due to foreign particles on a substrate having a pattern formed thereon or due to lack of an imprint material. Further, the electrical characteristics inspection apparatus is an apparatus that inspects the accuracy of electrical characteristics of semiconductor devices manufactured from a substrate having a pattern formed thereon.

Figure 2:
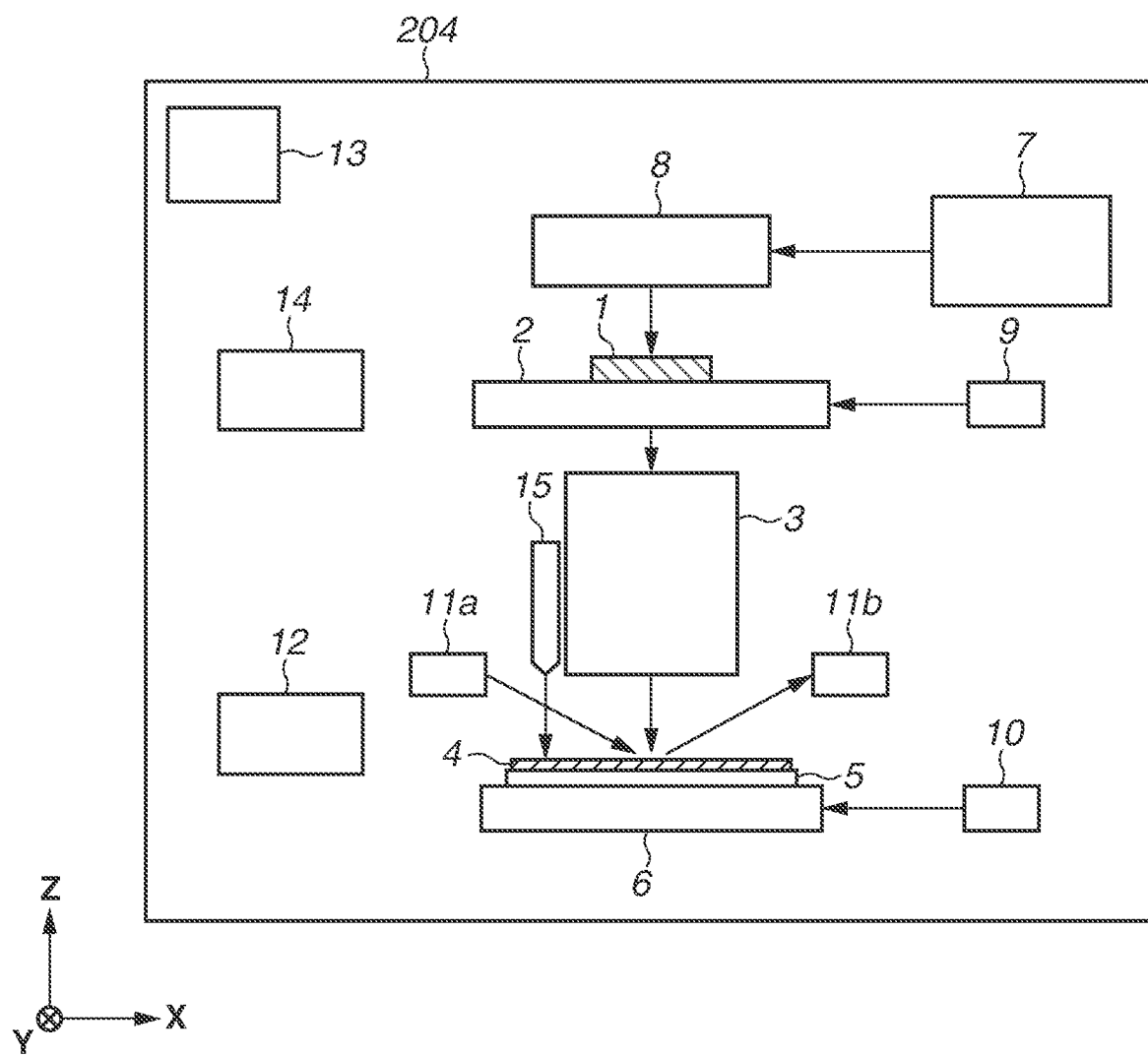
FIG. 2 is a diagram illustrating an exposure apparatus as an example of a pattern forming apparatus.

An exposure apparatus that exposes a wafer with light from a reticle having a pattern formed thereon will be described below as an example of the pattern forming apparatus 200. FIG. 2 is a diagram illustrating an exposure apparatus as an example of the pattern forming apparatus 200. An exposure apparatus of a step-and-scan method that performs exposure while synchronously driving a reticle stage and a wafer stage will be described below as an exposure apparatus 204 according to the present embodiment. Further, the exposure apparatus 204 is not limited to a scanner and can be an exposure apparatus of a step-and-repeat method that performs exposure with a wafer stage being stationary. In the example illustrated in FIG. 2, the exposure apparatus 204 includes a light source 7, an illumination optical system 8, a reticle stage 2, a projection optical system 3, a wafer stage 6, a wafer chuck 5, and a control unit 13. The exposure apparatus 204 further includes a laser interferometers 9 and 10, a focus sensor, a wafer conveyance unit 12, a reticle conveyance unit 14, and an alignment scope 15. Further, in FIG. 2, a direction that is parallel to an optical axis of the projection optical system 3 is a Z-axis direction, and two directions that are in a plane perpendicular to the Z-axis direction and are orthogonal to each other are respectively an X-axis direction and a Y-axis direction.

The light source 7 is, for example, a high-pressure mercury lamp, an argon fluoride (ArF) excimer laser, or a krypton fluoride (KrF) excimer laser. Further, the light source 7 does not have to be situated inside a chamber of the exposure apparatus 204 and can be an external light source. Light emitted from the light source 7 illuminates a reticle 1 via the illumination optical system 8. A pattern to be transferred onto a wafer 4 having a photosensitive material applied thereto is drawn on the reticle 1, and the reticle 1 is placed on the reticle stage 2. The reticle stage 2 holds the reticle 1 by suction via a reticle chuck and is movable by means of a linear motor, for example.

The projection optical system 3 projects an image of the pattern drawn on the reticle 1 onto the wafer 4 placed on the wafer chuck 5. In projecting the image of the pattern onto the wafer 4, an image that is inverted and reduced is projected at a projection magnification (e.g., one-fourth) onto the wafer 4 via the projection optical system 3. A region onto which the image of the pattern is projected is referred to as a shot region, and a plurality of shot regions is set to the wafer 4. The projection is repeatedly performed sequentially on the shot regions.

The wafer stage 6 is driven by an actuator of the linear motor to move in X- and Y-directions. The wafer chuck 5 is placed on the wafer stage 6 and holds the wafer 4. The wafer stage 6 positions the wafer chuck 5 in Z-, θ-, ωX-, and ωY-directions. Thus, the wafer 4 held by the wafer chuck 5 is moved by the driving of the wafer stage 6 and the wafer chuck 5.

The laser interferometer 9 measures the position of the reticle stage 2 in the Y-direction and measures the orientation of the reticle stage 2. The laser interferometer 9 includes a laser interferometer that similarly measures the position of the reticle stage 2 in the X-direction. The laser interferometer 10 measures the position of the wafer stage 6 with the wafer 4 placed thereon in the Y-direction and measures the orientation of the wafer stage 6. Further, the laser interferometer 10 includes a laser interferometer that similarly measures the position of the wafer stage 6 in the X-direction. The positions of the reticle stage 2 and the wafer stage 6 are controlled by the control unit 13 described below based on the positions measured by the laser interferometers 9 and 10.

The focus sensor includes a light projecting system 11a that projects light onto the wafer 4, a light receiving system 11b that receives reflection light from the wafer 4, and a detection unit that detects light from the light receiving system 11b and outputs a detection signal to the control unit 13. The light projecting system 11a and the light receiving system 11b are situated to sandwich a neighborhood of an emission portion of the projection optical system 3. The light projecting system 11a projects oblique incident light onto the wafer 4, and the light receiving system 11b captures light reflected on the opposite side. The control unit 13 described below measures the position of the wafer 4 in the Z-direction from the detection signal detected by the focus sensor and controls the movement of the wafer 4 by the wafer stage 6.

The wafer conveyance unit 12 conveys the wafer 4. The wafer conveyance unit 12 conveys the wafer 4 from a wafer storage container for storing the wafer 4 to the wafer stage 6. Further, the wafer conveyance unit 12 conveys the wafer 4 from the wafer stage 6 to the wafer storage container.

The reticle conveyance unit 14 conveys the reticle 1. The reticle conveyance unit 14 conveys the reticle 1 from a reticle storage container for storing the reticle 1 to the reticle stage 2. Further, the reticle conveyance unit 14 conveys the reticle 1 from the reticle stage 2 to the reticle storage container.

The alignment scope 15 acquires a digital image signal of a captured image of a mark formed on the wafer 4 to position (align) the wafer 4 held on the wafer chuck 5. The alignment scope 15 includes an image sensor and an analog/digital (A/D) conversion unit. The image sensor outputs an intensity image signal based on the brightness, i.e., intensity, of the reflection light from the wafer 4. The A/D conversion unit converts the intensity image signal acquired from the image sensor into a digital image signal. The control unit 13 described below detects the position of the mark formed on the wafer 4 using the acquired digital image signal, controls the wafer stage 6 based on the detected position of the mark, and positions the wafer 4.

The control unit 13 controls an exposure process on the wafer 4 by controlling operations and adjustments of the components of the exposure apparatus 204. The control unit 13 includes, for example, a programmable logic device (PLD) such as a field programmable gate array (FPGA), an application-specific integrated circuit (ASIC), a computer with a program embedded therein, or a combination of all or some of the foregoing components. Further, the control unit 13 can be integrated with another part of the exposure apparatus 204 (the control unit 13 and the other part can be provided in the same housing) or can be provided separately from the other part of the exposure apparatus 204 (the control unit 13 and the other part can be provided in different housings). Further, the control unit 13 applies information acquired from a storage apparatus described below to control execution of the exposure process (pattern forming process) on the wafer 4.

Figure 3:
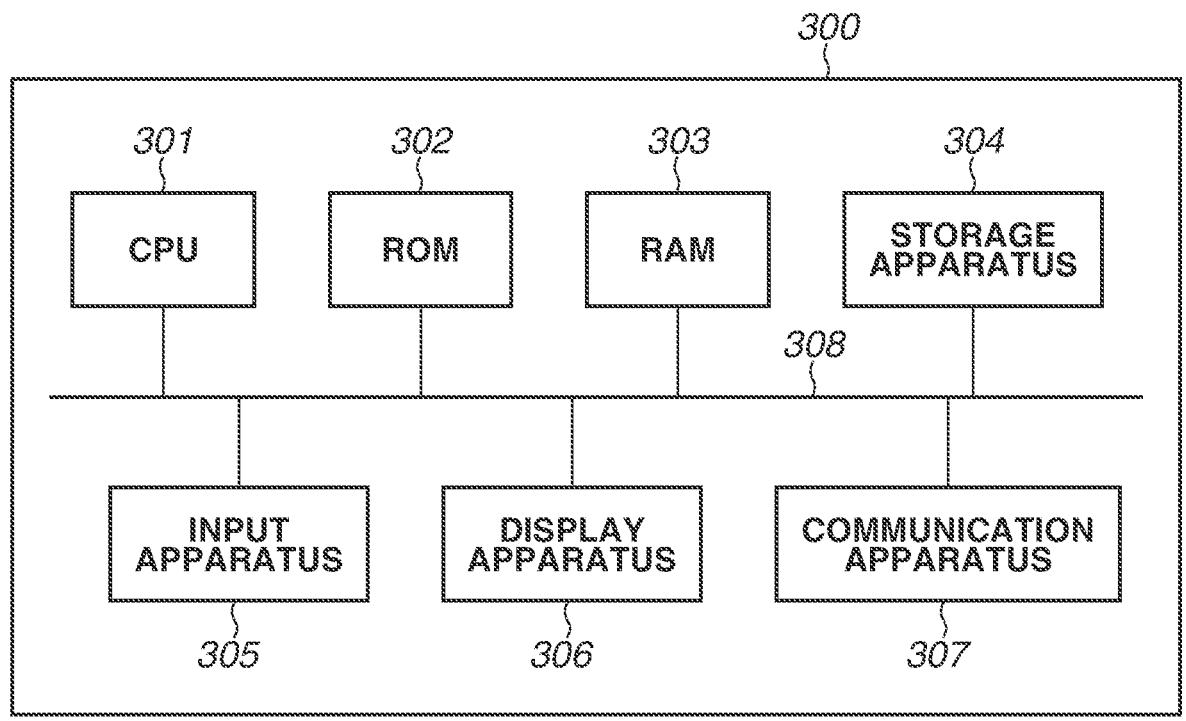
FIG. 3 is a diagram illustrating a hardware configuration of an information processing apparatus.

Next, the management apparatus 300 will be described. FIG. 3 is a diagram illustrating a hardware configuration of an information processing apparatus. The information processing apparatus includes a central processing unit (CPU) 301, a read-only memory (ROM) 302, a random access memory (RAM) 303, a storage apparatus 304, an input apparatus 305, a display apparatus 306, and a communication apparatus 307. Each piece of hardware of the information processing apparatus functions based on a program. In the example illustrated in FIG. 3, the CPU 301 is a processing apparatus that executes calculations for control based on the program and controls each component connected to a bus 308. The ROM 302 is a dedicated memory for reading data and stores programs and data. The RAM 303 is a memory for reading and writing data and is used to store programs and data. The RAM 303 is used to temporarily store data such as results of calculations by the CPU 301. The storage apparatus 304 is used to store programs and data. The storage apparatus 304 is also used as an area for temporarily storing a program of an operating system (OS) of the information processing apparatus and data.

The storage apparatus 304 is slower in data input and output than the RAM 303 but is capable of storing a large amount of data. The storage apparatus 304 is desirably a non-volatile storage apparatus that stores data as permanent data for long-term reference. The storage apparatus 304 for instance includes a magnetic storage apparatus (hard disk drive (HDD)) or a solid state drive (SSD) but can be an apparatus to which an external medium such as a compact disk (CD), a digital versatile disk (DVD), a memory card or the like, is to be attached to read and write data.

The input apparatus 305 is an apparatus for inputting characters and data to the information processing apparatus. The input apparatus 305 is various keyboards and mouses. The display apparatus 306 is an apparatus that plays the role as a user interface of the management apparatus 300 and displays necessary information for operations of the information processing apparatus and process results. The display apparatus 306 is a cathode ray tube (CRT) or a liquid crystal monitor. The display apparatus 306 that is operable by touching a screen, such as a touch panel, also plays the role of the input apparatus 305. While the input apparatus 305 and the display apparatus 306 are described as a part of the management apparatus 300, the input apparatus 305 and the display apparatus 306 are not limited to those described and can be, for example, a part of the pattern forming apparatus 200.

The communication apparatus 307 is used to communicate with another apparatus by connecting to a network and performing data communication based on communication protocols such as Transmission Control Protocol over Internet Protocol (TCP/IP). Further, the information processing apparatus can include a graphical processing unit (GPU) to enable high-speed calculation processing. The management apparatus 300 is an information processing apparatus and connects to the plurality of exposure apparatuses 204 via the communication apparatus 307 to communicate data with the plurality of exposure apparatuses 204.

Figure 4:
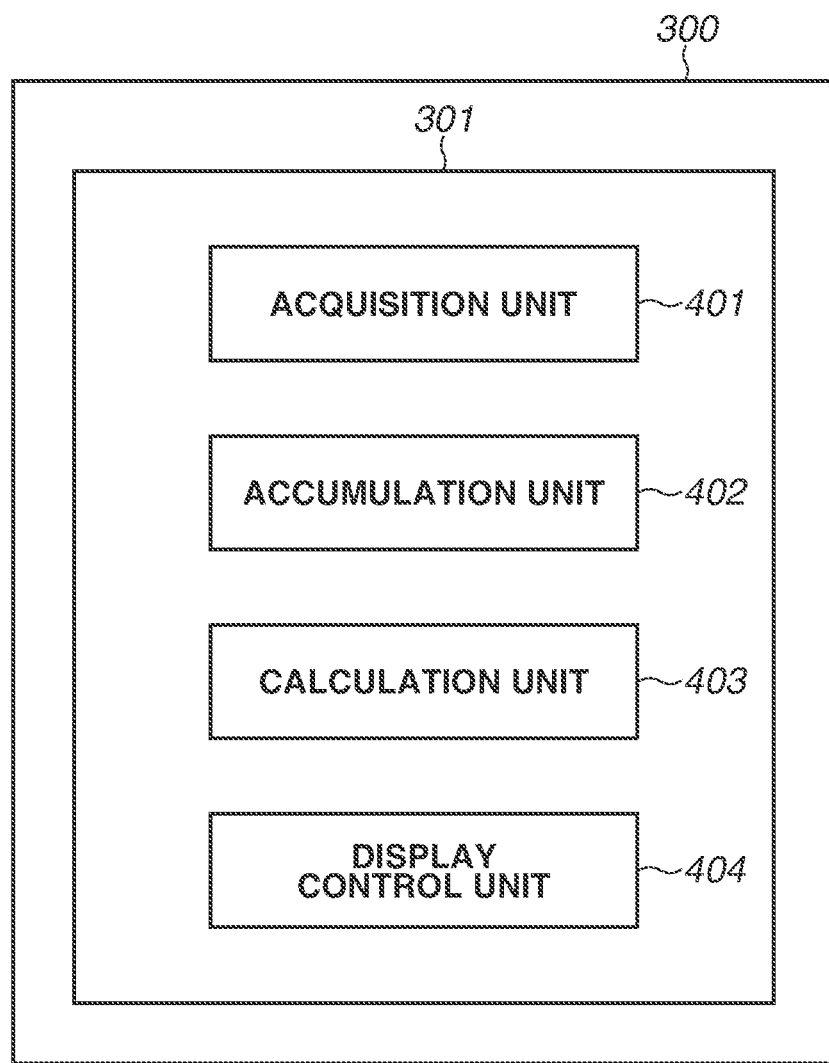
FIG. 4 is a diagram illustrating a configuration of a central processing unit (CPU) of a management apparatus.
Figure 5:
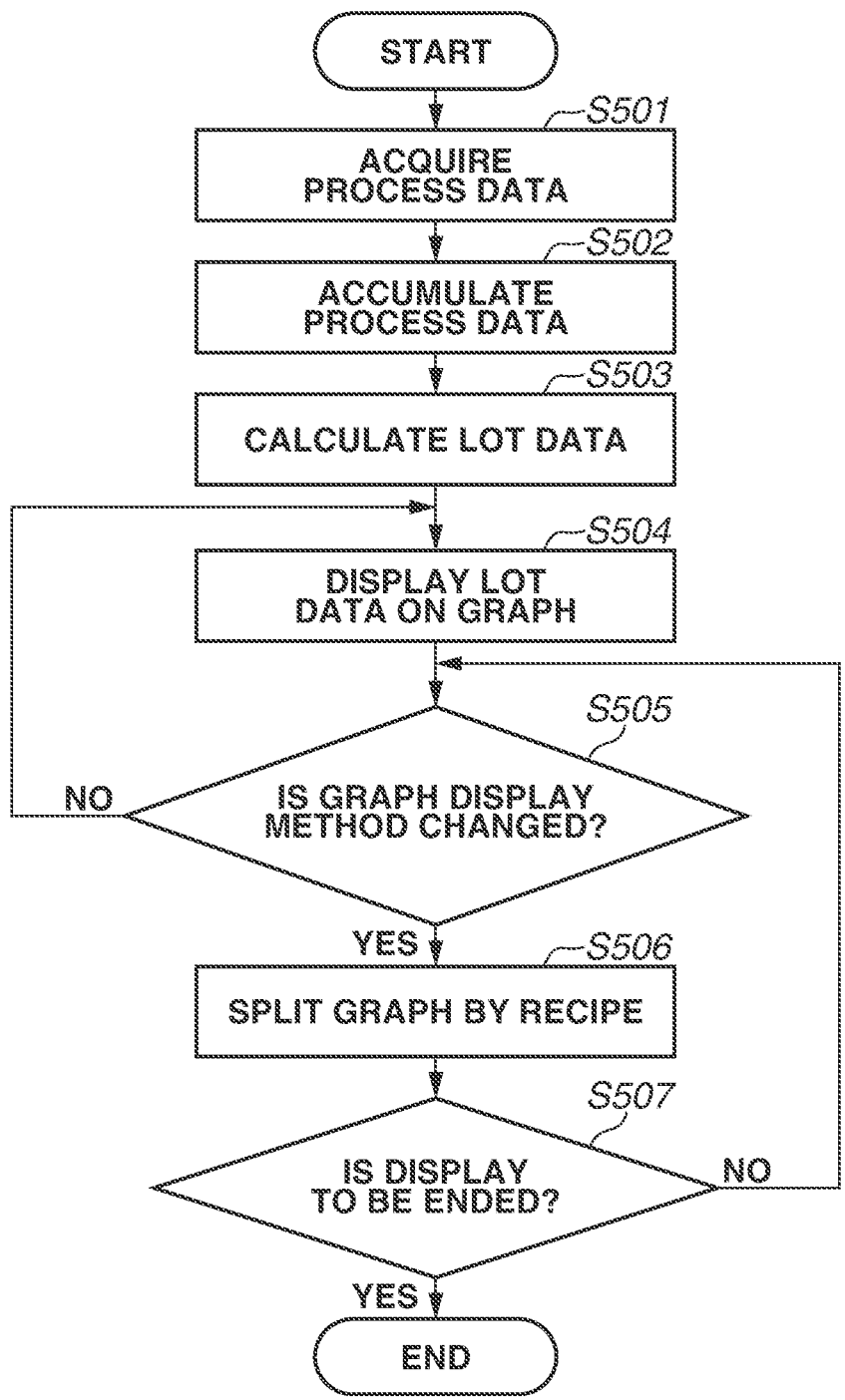
FIG. 5 is a flowchart illustrating a display process of a display apparatus.

FIG. 4 is a diagram illustrating a configuration of the CPU 301 of the management apparatus 300. The CPU 301 includes an acquisition unit 401, an accumulation unit 402, a calculation unit 403, and a display control unit 404. FIG. 5 is a flowchart illustrating a user interface display process for analyzing a failure that has occurred in an exposure apparatus.

The display process of the display apparatus 306 of the management apparatus 300 according to the present embodiment will be described with reference to FIGS. 4 and 5. In the present embodiment, the display of the display apparatus 306 reduces the time needed to analyze a cause of a failure in the exposure apparatus 204. The term "failure" in the present embodiment refers to a failure that is significant enough to stop the exposure apparatus 204 and also refers to a failure that decreases the accuracy of the exposure apparatus 204 to affect productivity.

The flowchart illustrated in FIG. 5 will be described. In step S501, the acquisition unit 401 acquires process information about the exposure apparatus 204. The process information about exposure apparatus 204 includes process data of the exposure apparatus 204 and a process condition applied in the exposure process. The process data of the exposure apparatus 204 is information including an operation result of the exposure apparatus 204 and a state of the wafer 4 exposed by the exposure apparatus 204. The content of the process data is specifically synchronization accuracy data and alignment accuracy data. The synchronization accuracy data is data that represents an error in relative positions of the reticle stage 2 and the wafer stage 6 during a period of, for example, synchronously driving the reticle stage 2 and the wafer stage 6 in the Y-axis direction to expose a target shot region. Further, the alignment accuracy data is data that represents waveform data of the digital image signal acquired by capturing the image of the mark formed on the target wafer 4 and an evaluation (the symmetry of the waveform data, the contrast of the digital image signal) of the digital image signal.

The process condition applied in the exposure process refers to a recipe determined for each recipe of a wafer to be manufactured and an apparatus parameter determined for each exposure apparatus 204. The recipe is the process condition that is shared and used by the plurality of exposure apparatuses 204. The apparatus parameter is the process condition that is not shared by the plurality of exposure apparatuses 204. The recipe is, for example, the amount of exposure in wafer exposure and the selection of an individual correction value and a correction algorithm to follow an exposed pattern. The apparatus parameter is, for example, a correction value of the projection optical system 3, a method of controlling the wafer stage 6, and a control parameter. Further, the process conditions are not limited to those described above, and a parameter that defines another process condition can be displayed.

Next, in step S502, the process data and the process condition of the exposure apparatus 204 acquired in step S501 are accumulated in the accumulation unit 402. As to the process data, for example, wafer-based process data (on a substrate-by-substrate basis) is accumulated in the accumulation unit 402.

In step S503, the calculation unit 403 calculates lot data that is lot-based process data based on the wafer-based process data accumulated in the accumulation unit 402. The lot data is calculated based on statistical values (e.g., maximum value, minimum value, mean value, median value, standard deviation) of the wafer-based process data. Further, the lot data can be calculated by the exposure apparatus 204 instead of the calculation unit 403. For example, the acquisition unit 401 can acquire the lot data calculated by the exposure apparatus 204 from the exposure apparatus 204, and the processing proceeds to step S504.

Figure 6:
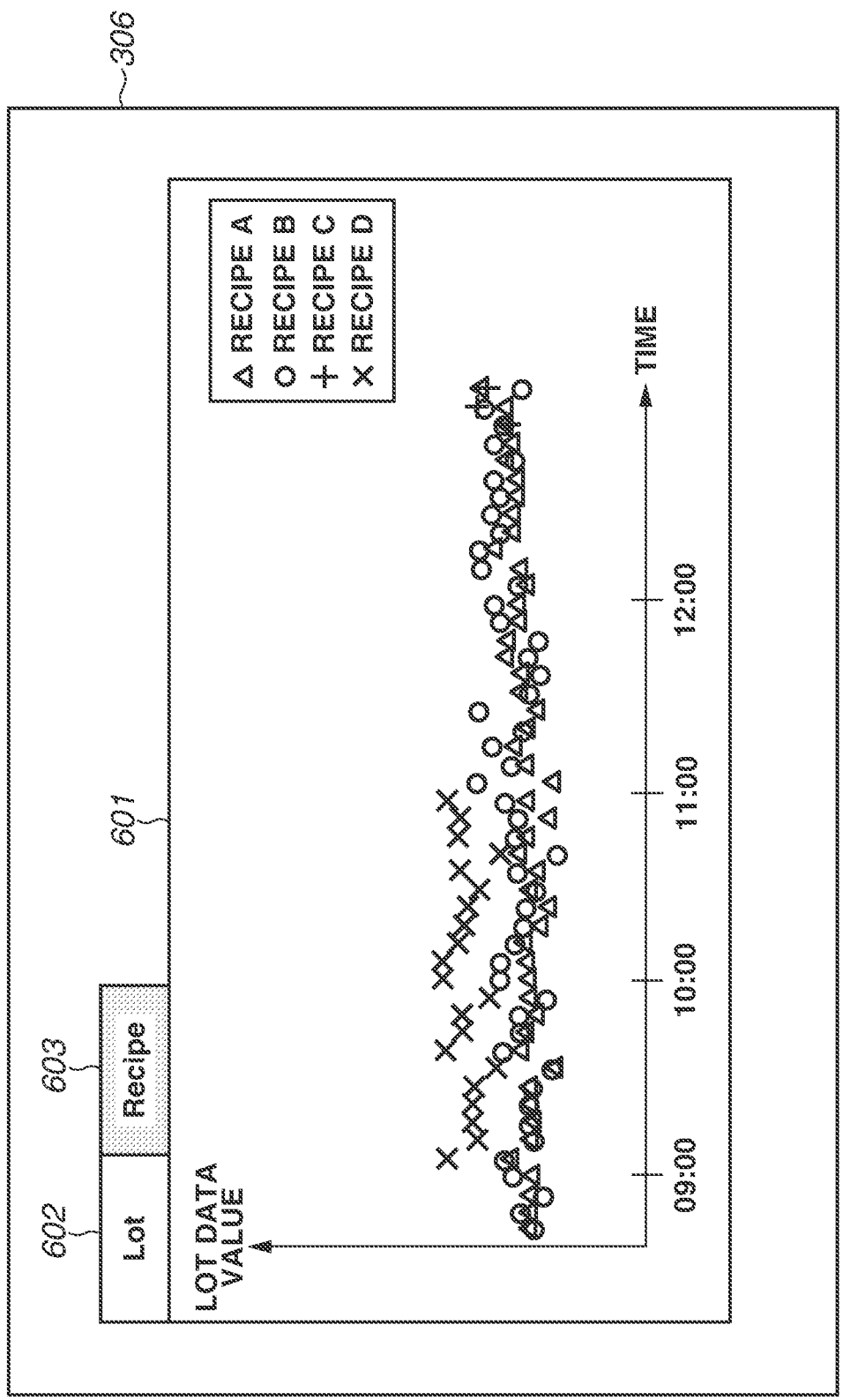
FIG. 6 is a diagram illustrating a display in which pieces of lot data of different recipes are superimposed and displayed on the same graph.

In step S504, the display control unit 404 outputs the lot data calculated in step S503 to the display apparatus 306 and controls the display apparatus 306 to display the lot data as illustrated in FIG. 6. A graph 601 displays pieces of lot data to which different recipes are applied in the same region on a single graph in a superimposed manner. The graph 601 is displayed chronologically. The horizontal axis of the graph 601 represents the time of execution of the exposure process. The vertical axis of the graph 601 represents the lot data value, which are lot-based process data values.

Selection buttons 602 and 603 change a display method of the graph 601. FIG. 6 illustrates a state where the selection button 602 is selected. The user can change the display method of the graph 601 by selecting the selection button 603. The selection buttons 602 and 603 can be combined into a single button.

In step S505, the display control unit 404 determines whether the display method of the graph has been changed. Specifically, the display control unit 404 determines whether the selection button 603 is selected by the user. In a case where the selection button 603 is selected (YES in step S505), the processing proceeds to step S506. A method of selecting the selection button 603 is implemented by an input device for a computer, such as a mouse, a keyboard, or a touch panel, and a program that controls the input device.

Figure 7:
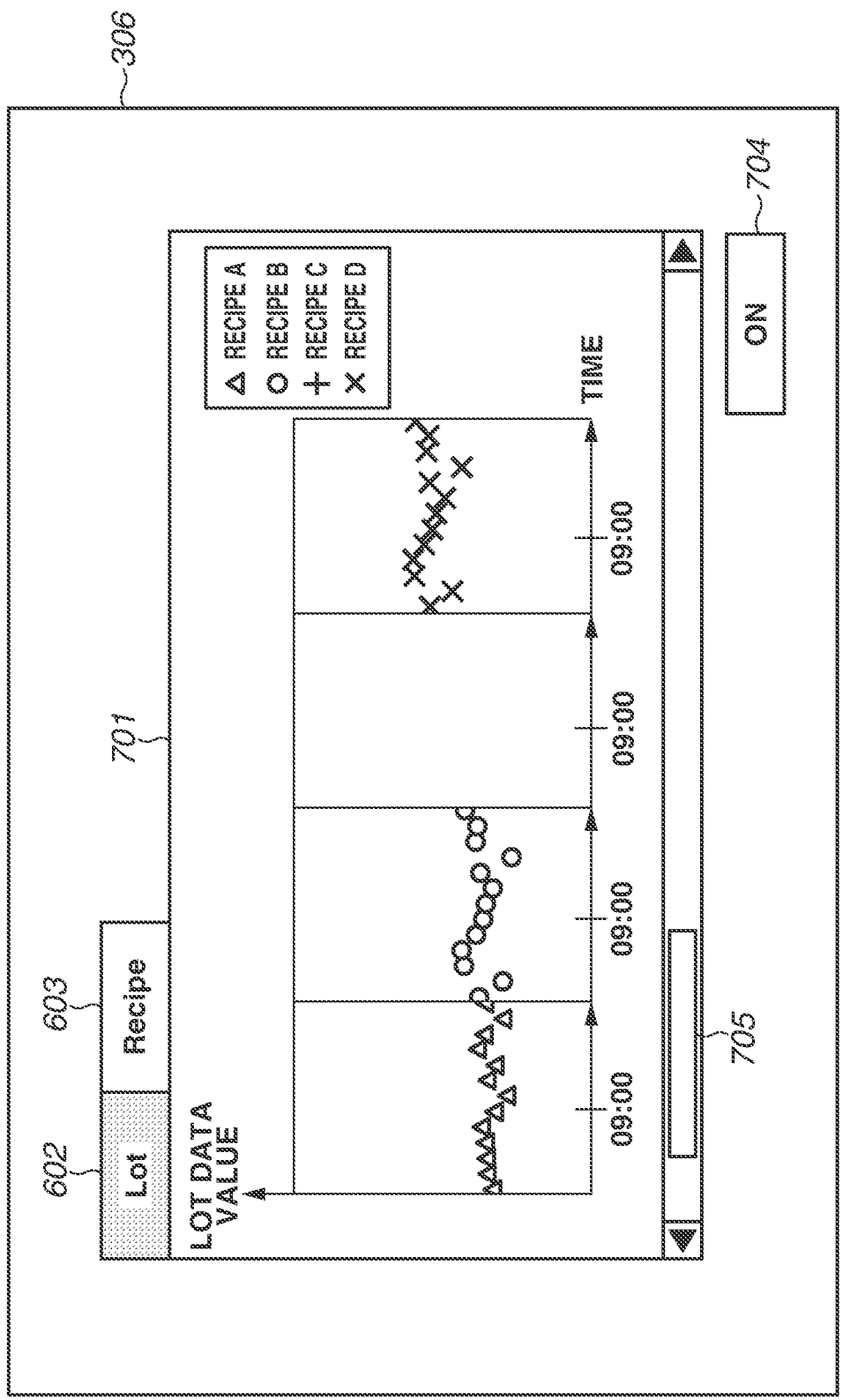
FIG. 7 is a diagram illustrating a display of pieces of lot data of recipes that are respectively displayed in different graphs.

In step S506, the display control unit 404 outputs the lot data calculated in step S503 to the display apparatus 306 and controls the display apparatus 306 to display the lot data as illustrated in FIG. 7. A graph 701 is a graph having a separate display region for each recipe, and each piece of lot data is displayed in a different graph. The graph 701 is displayed chronologically. The horizontal axis of the graph 701 represents the time of execution of the exposure process and is split by recipes. The vertical axis of the graph 701 represents the lot data value. The lot data values are lot-based process data values. A scroll bar 705 is a scroll bar for changing the display position of the graph 701. A range of the lot data that is not displayed in FIG. 7 can be displayed on the display apparatus 306 using the scroll bar 705. Further, by selecting the selection button 602 in the state where the lot data of each recipe is displayed in a different graph as illustrated in FIG. 7, the user can return to the state where the pieces of lot data to which the different recipes are respectively applied are superimposed and displayed on the single graph as illustrated in FIG. 6.

Figure 8:
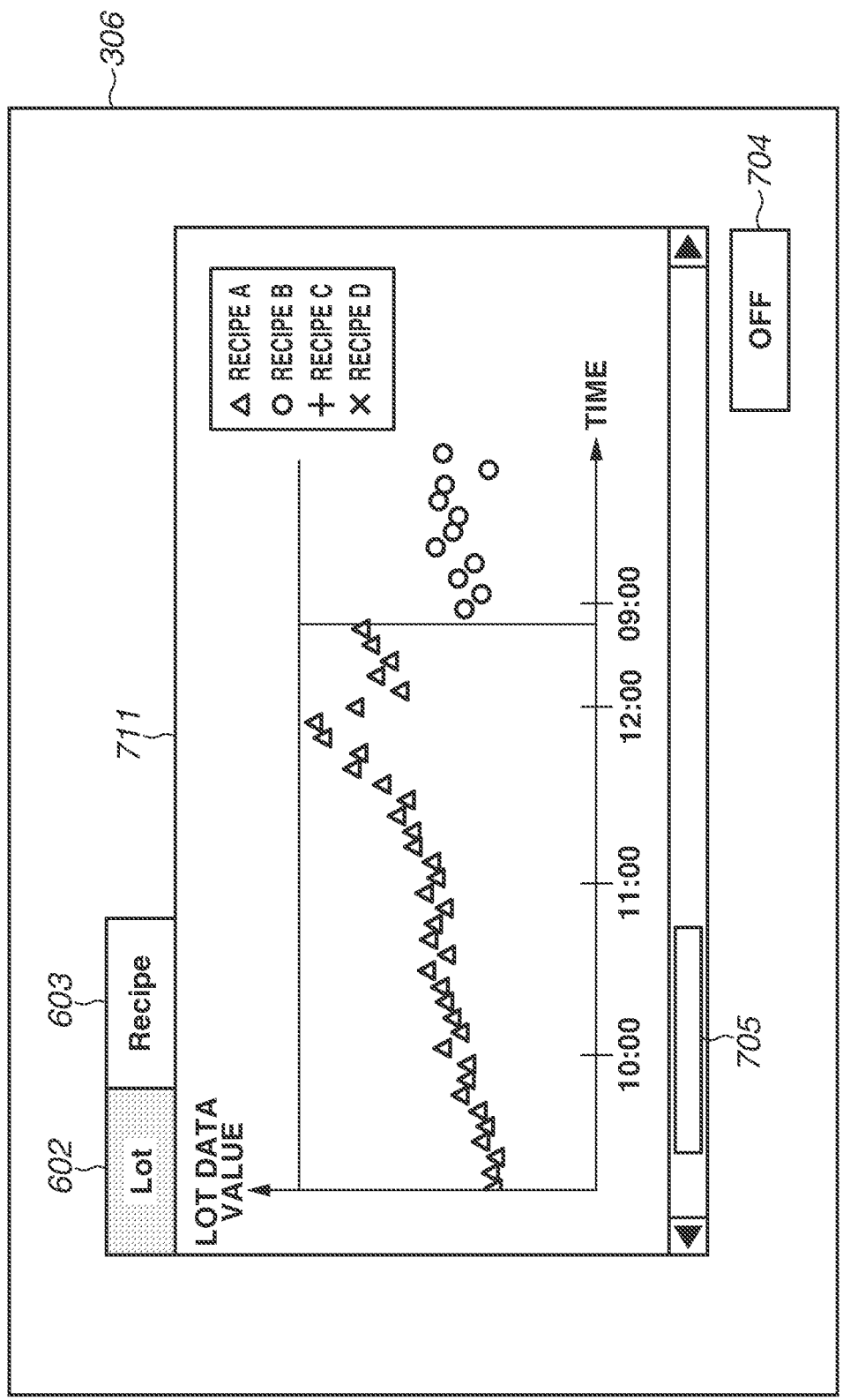
FIG. 8 is a diagram illustrating a graph having different time axes.

A setting button 704 is a button for selecting whether to display the recipes of the same time range in the graphs. As illustrated in FIG. 7, in the state where the setting button 704 is on, the recipes of the same time range are displayed in the graphs as in the graph 701. FIG. 8, on the contrary, is a diagram illustrating the state where the setting button 704 is off. FIG. 8 is a diagram displaying the lot data of each recipe in a different graph as in FIG. 7, but the displayed time ranges of the recipes are different in a graph 711. Thus, in a case where there is a change with time in a specific recipe, an overall trend of the single recipe can be viewed, so that it is easy to determine the trend from the display. Further, the recipes to be displayed and the time range of each recipe can be changed using the scroll bar 705.

In step S507, in a case where the user determines to end the screen, the display on the display apparatus 306 is ended.

The user can selectively select the most suitable graph display for identifying the cause of a failure as described above. For example, it is possible to determine the trends of the recipes from the graph illustrated in FIG. 6 when the lot data displays are not superimposed, but it is difficult to determine a trend each recipe has in a case when the lot data displays are superimposed. On the other hand, it is difficult to determine an overall trend of each recipe at a glance from the graph illustrated in FIG. 7 because the displayed time range is small due to the presence of the plurality of graphs, but it is possible to determine a trend of each recipe by moving the scroll bar 705. From FIG. 7, the user can instantly determine that the lot data values of a recipe D are greater than the lot data values of recipes A and B, so that the user can promptly execute an operation to overcome the failure. It can be seen that a wafer process by a recipe C is not executed during the time displayed in the graph 701. Further, the graphs 601, 701, and 711 in FIGS. 6, 7, and 8 can be displayed together in the display apparatus 306 instead of switching the displays of the graphs 601, 701, and 711.

Further, while the lot data is described as a statistical value of process data of a single lot, the lot data is not limited to that described above and can be a statistical value of process data of a plurality of lots to which the same recipe is applied. Further, while the lot data of each recipe is displayed in a different graph in FIGS. 7 and 8 according to the description of the present embodiment, the present embodiment is not limited to that described above, and the lot data of each exposure apparatus 204 can be displayed in a different graph.

While an example in which the cause of a failure in the pattern forming apparatus 200 such as the exposure apparatus 204 is analyzed was described above in the present embodiment, the present embodiment is also applicable to the analysis of the cause of a failure in a semiconductor manufacturing apparatus other than the pattern forming apparatus 200. For example, an information processing apparatus according to the present embodiment is applicable to the analysis of the cause of a failure in the processing apparatus 201 or the inspection apparatus 202.

As described above, according to the present embodiment, the display apparatus 306 can display the lot data of each recipe in a different graph. This reduces the time needed to overcome a failure due to a recipe.

In a second embodiment, an example in which change history information is displayed together with lot data will be described below. The change history information is information about changes of exposure process conditions. Items that are not described in the present embodiment are as described in the first embodiment.

Figure 9:
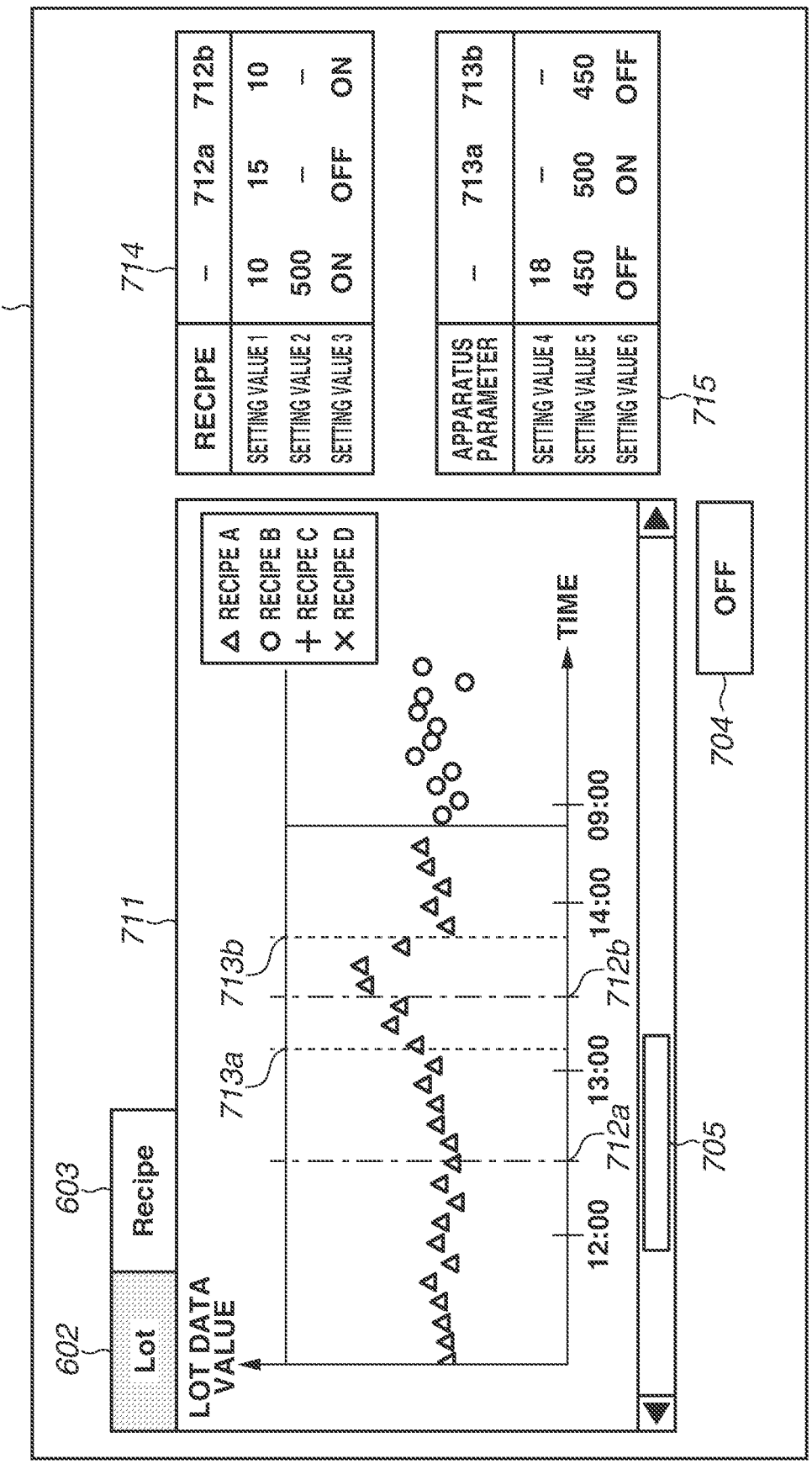
FIG. 9 is a diagram illustrating a display of change history information.

FIG. 9 is a diagram illustrating the change history information displayed together with the graph display illustrated in FIG. 8. The change history information is information about the process condition and the time during which the process condition is applied. Lines 712a and 712b each specify the time at which the recipe parameter is changed on the graph 711, indicating that the recipe parameter before the line 712a is different from the recipe parameter after the line 712a and that the recipe parameter before the line 712b is different from the recipe parameter after the line 712b. Lines 713a and 713b each specify the time at which the apparatus parameter is changed on the graph 711, indicating that the recipe parameter before the line 713a is different from the recipe parameter after the line 713a and that the recipe parameter before the line 713b is different from the recipe parameter after the line 713b.

A process condition 714 displays details of the changes of the recipe parameters corresponding to the lines 712a and 712b. Setting values 1 and 3 are changed at the time specified by the line 712a and are returned to the initial recipe parameters at the time specified by the line 712b. A setting value 2 is not changed. A process condition 715 displays details of the changes of the apparatus parameters corresponding to the lines 713a and 713b. Setting values 5 and 6 are changed at the time specified by the line 713a and are returned to the initial apparatus parameters at the time specified by the line 713b. A setting value 4 is not changed.

The lines 712a, 712b, 713a, and 713b are useful for the user to visually determine whether the trend of the lot data before the time at which the process condition is changed is different from the trend after that time. The user can check whether the trends of the lot data before the time specified by the lines 712a, 712b, 713a, and 713b are different from the trends after that time, and in a case where the trends are different, the user can instantly perform an operation.

In the example illustrated in FIG. 9, the user first checks the lines 712a, 712b, 713a, and 713b. At this time, it is determined that the lot data changes at the setting change at the line 713a. Thus, the user changes the setting values 5 and 6 to the original apparatus parameters at the setting change at the line 713b. As a result, the lot data at and after the time specified by the line 713b is corrected to the trend of the lot data at and before the time specified by the line 713a.

Further, while the information about the time of application of each process condition is specified by the lines 712a, 712b, 713a, and 713b, a method of specifying the information is not limited to that described above, and an arrow or a mark that can specify the time on the graph 711 can be used. Further, a parameter that defines a process condition other than the recipe parameters and the apparatus parameters of the process conditions 714 and 715 can also be displayed as a process condition.

As described above, according to the present embodiment, the change history information, which is information about changes of the exposure process conditions, is displayed. This facilitates the analysis of a failure in the exposure apparatus 204 and reduces the time needed to overcome the failure.

In a third embodiment, an example in which the process conditions of user-designated lots are displayed will be described below. Items that are not described in the present embodiment are as described in the first embodiment.

Figure 10:
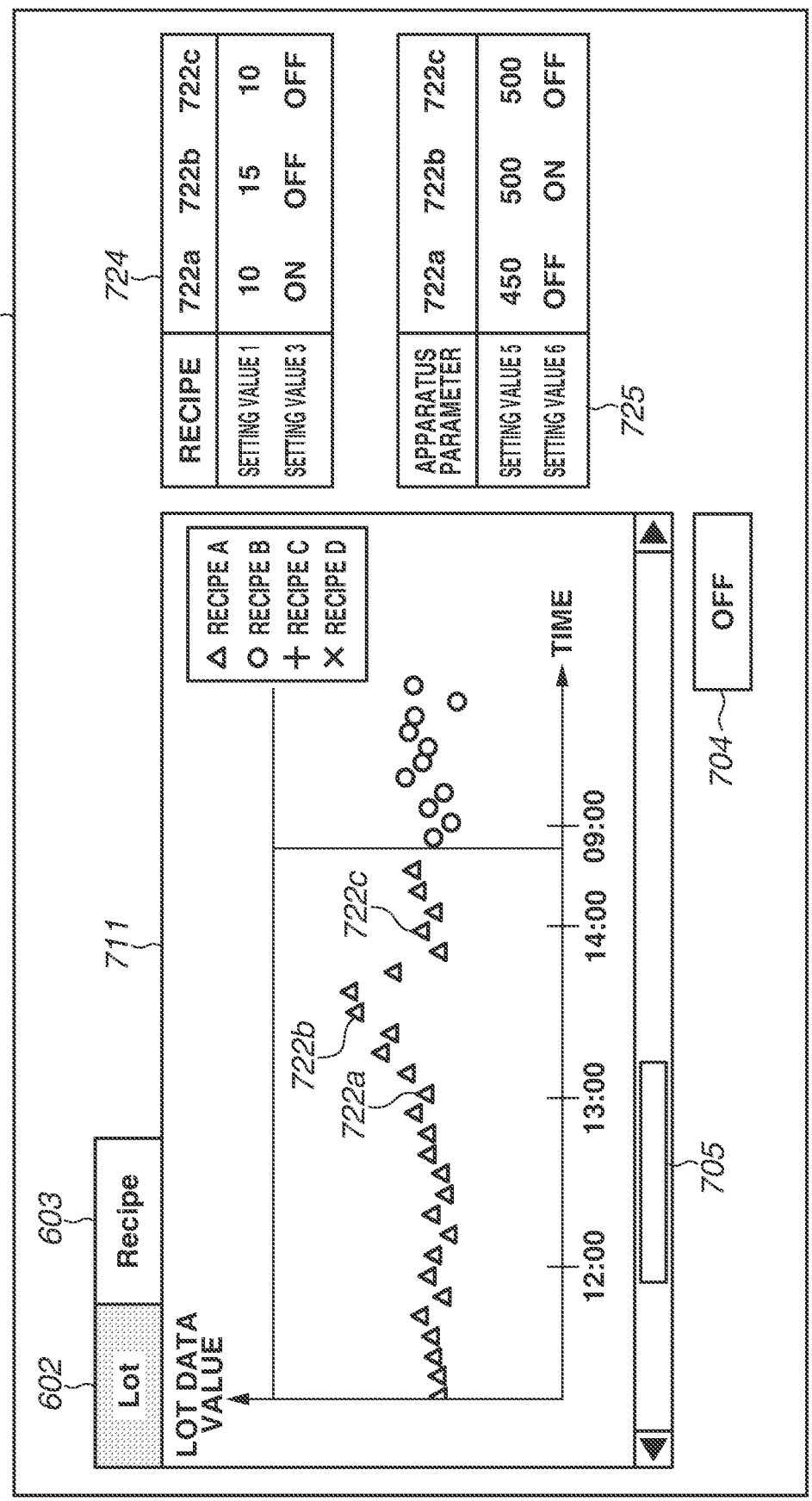
FIG. 10 is a diagram illustrating a display of process conditions of selected lots.

FIG. 10 is a diagram illustrating the process conditions of the user-designated lots displayed together with the graph display illustrated in FIG. 8. Further, the user designates the lots by selecting the lot data plotted on the graph 711 or by entering the names of the lots. A lot designation method is implemented by an input device for a computer, such as a mouse, a keyboard, or a touch panel, and a program that controls the input device.

A process condition 724 displays the recipe parameters that are applied to lot data 722a to lot data 722c. A process condition 725 displays the apparatus parameters that are applied to the lot data 722a to lot data 722c. To make it easier for the user to compare the lot data 722a to lot data 722c, the parameters displayed in the process conditions 724 and 725 that have a difference can be highlighted, or only the parameters that have a difference can be displayed in the process conditions 724 and 725. Further, the parameters can be displayed based on a pre-set priority order, or the parameters that are determined as unnecessary parameters based on pre-set information can be not displayed.

In the example illustrated in FIG. 10, the user first searches for a feature point of a change in the lot data from the graph 711. The user designates the lot data 722a to 722c of the feature point and its neighborhood. The display apparatus 306 displays the process conditions 724 and 725 applied to the lot data 722a to lot data 722c. From the displayed process conditions 724 and 725, the user can determine that the changes in the setting values 1, 3, 5, and 6 relate to the changes in the trends of the lot data. Thus, the user can correct the settings of the setting values 1, 3, 5, and 6 to overcome the failure.

Further, in a modified example of a combination of the second embodiment and the present embodiment, the process conditions 724 and 725 of the user-designated lot data can be displayed with the lines 712a, 712b, 713a, and 713b illustrated in FIG. 9 on the graph 711.

As described above, according to the present embodiment, the process conditions of the user-designated lot are displayed to make it easier to identify the process condition in which a failure has occurred. This reduces the time needed to overcome the failure.

Embodiments of Article Manufacturing Methods

An article manufacturing method according to an embodiment of the present invention is suitable for manufacturing articles such as micro devices, i.e., semiconductor devices, and elements having a fine structure. The article manufacturing method according to the present embodiment can include forming a pattern of an original plate on a substrate using the article manufacturing system and processing the substrate having the formed pattern thereon. The article manufacturing method can further include other well-known processes (oxidation, film forming, vapor deposition, doping, flattening, etching, resist removing, dicing, bonding, packaging). The article manufacturing method according to the present embodiment is more advantageous than conventional methods in at least one of the performance, quality, productivity, and production costs of articles.

The present invention is directed to a technique that is advantageous in reducing the time of analyzing a cause of a failure in a semiconductor manufacturing apparatus.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a solid state disk (SSD), a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to embodiments, it is to be understood that the invention is not limited to the disclosed embodiments, but is defined by the scope of the following claims.

This application claims the benefit of Japanese Patent Application No. 2020-079055, filed Apr. 28, 2020, which is hereby incorporated by reference herein in its entirety.

What is claimed is:

1. An information processing apparatus comprising:
a processor; and
a memory for storing instructions to be executed by the processor,
wherein the instructions stored in the memory are executed by the processor to:
  acquire information containing first process data indicating a result of a substrate process in a first process condition and second process data indicating a result of a substrate process in a second process condition different from the first process condition, and
  control a display on a display apparatus based on the acquired information, and
  wherein control is performed to selectively display, on the display apparatus, a first screen displaying a first data group in which the first process data is arranged chronologically and a second data group in which the second process data is arranged chronologically, the first screen displaying the first data group in a region and the second data group in another region, and a second screen displaying the first data group and the second data group in the same region.

2. The information processing apparatus according to claim 1, wherein the first process data and the second process data are information containing a result of an operation of a processing apparatus that performs the substrate process and containing a state of a substrate having undergone the substrate process.

3. The information processing apparatus according to claim 1, wherein the first process condition and the second process condition are a condition including a recipe, which is a process condition to be shared and used by a plurality of apparatuses, and an apparatus parameter, which is a process condition not to be shared by the plurality of apparatuses.

4. The information processing apparatus according to claim 1, wherein the first process data and the second process data are chronologically displayed on a graph.

5. The information processing apparatus according to claim 4, wherein the display apparatus displays change history information of a process condition which has been changed.

6. The information processing apparatus according to claim 1, wherein the processor is further configured to calculate lot-based process data based on the acquired substrate-based process data, the lot including a plurality of substrates.

7. The information processing apparatus according to claim 6, wherein the processor is further configured to calculate the lot-based process data based on one statistical value from a maximum value, a minimum value, a mean value, a median value, and a standard deviation of the substrate-based process data, the lot including the plurality of substrates.

8. The information processing apparatus according to claim 1, wherein the processor is further configured to control displaying a process condition of a user-designated lot including a plurality of substrates on the display apparatus.

9. An information processing method comprising:
acquiring information containing first process data indicating a result of the substrate process in a first process condition and second process data indicating a result of a substrate process in a second process condition different from the first process condition; and
controlling a display on a display apparatus based on the acquired information,
wherein the control is performed to selectively display, on the display apparatus, a first screen displaying a first data group in which the first process data is arranged chronologically and a second data group in which the second process data is arranged chronologically, the first screen displaying the first data group in a region and the second data group in another region, and a second screen displaying the first data group and the second data group in the same region.

10. A non-transitory computer-readable storage medium that stores a program for causing a computer to execute an information processing method comprising acquiring and controlling a display,
wherein information containing first process data indicating a result of the substrate process in a first process condition and second process data indicating a result of a substrate process in a second process condition different from the first process condition is acquired in the acquiring, and
wherein a display on a display apparatus is controlled based on the acquired information, and a first screen displaying a first data group in which the first process data is arranged chronologically and a second data group in which the second process data is arranged chronologically are displayed, the first screen displaying the first data group in a region and the second data group in another region, and a second screen displaying the first data group and the second data group in the same region.

11. An article manufacturing system comprising:
an information processing apparatus; and
a pattern forming apparatus configured to form a pattern on a substrate,
wherein the information processing apparatus manages a plurality of apparatuses including the pattern forming apparatus,
the information processing apparatus comprising:
a processor; and
a memory for storing instructions to be executed by the processor,
  wherein the instructions stored in the memory are executed by the processor to:
  acquire information containing first process data indicating a result of the substrate process in a first process condition and second process data indicating a result of a substrate process in a second process condition different from the first process condition, and
  control a display on a display apparatus based on the acquired information,
  wherein control is performed to selectively display, on the display apparatus, a first screen displaying a first data group in which the first process data is arranged chronologically and a second data group in which the second process data is arranged chronologically, the first screen displaying the first data group in a region and the second data group in another region, and a second screen displaying the first data group and the second data group in the same region.

12. An article manufacturing method comprising:
forming a pattern on a substrate using a pattern forming apparatus managed by an information processing apparatus; and
performing at least one process from oxidation, film forming, vapor deposition, doping, flattening, etching, resist removing, dicing, bonding, and packaging on the substrate having the pattern formed thereon,
wherein an article is manufactured from the processed substrate,
the information processing apparatus comprising:
a processor; and
a memory for storing instructions to be executed by the processor,
wherein the instructions stored in the memory are executed by the processor to:
acquire information containing first process data indicating a result of the substrate process in a first process condition and second process data indicating a result of a substrate process in the second process condition different from the first process condition, and
control a display on a display apparatus based on the acquired information,
wherein control is performed to selectively display, on the display apparatus, a first screen displaying a first data group in which the first process data is arranged chronologically and a second data group in which the second process data is arranged chronologically, the first screen displaying the first data group in a region and the second data group in another region, and a second screen displaying the first data group and the second data group in the same region.

* * * * *